(12) United States Patent
Fan et al.

(10) Patent No.: US 10,645,827 B2
(45) Date of Patent: May 5, 2020

(54) FLEXIBLE HOUSING AND FABRICATION METHOD THEREOF

(71) Applicant: Lenovo (Beijing) Co., Ltd., Beijing (CN)

(72) Inventors: Xiaoli Fan, Beijing (CN); Run Yang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/368,766

(22) Filed: Mar. 28, 2019

(65) Prior Publication Data

US 2019/0307004 A1   Oct. 3, 2019

(30) Foreign Application Priority Data

Mar. 30, 2018   (CN) .......................... 2018 1 0294754

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01)

(58) Field of Classification Search
CPC ...................................................... H05K 7/00
See application file for complete search history.

(56) References Cited

U.S. PATENT DOCUMENTS

| D769,209 S | * | 10/2016 | Byun | .................... D14/138 AB |
| 2016/0014914 A1 | | 1/2016 | Stroetmann | |
| 2018/0046214 A1 | * | 2/2018 | Inagaki | ............... H01L 51/0097 |

FOREIGN PATENT DOCUMENTS

| CN | 105799114 A | 7/2016 |
| CN | 205378396 U | 7/2016 |
| CN | 205454263 U | 8/2016 |
| CN | 106879197 A | 6/2017 |
| CN | 107657895 A | 2/2018 |
| JP | 2007168272 A | 7/2007 |
| WO | 2017047944 A1 | 3/2017 |

* cited by examiner

*Primary Examiner* — Jerry Wu
(74) *Attorney, Agent, or Firm* — Anova Law Group, PLLC

(57) ABSTRACT

The present disclosure provides a flexible housing, a fabrication method thereof, and an electronic device. The flexible housing includes: a rigid frame including at least two separate rigid members; an elastic fiber web, where two ends of the elastic fiber web are coupled to the two rigid members to form a bending portion; a flexible outer casing arranged over an outer surface of the elastic fiber web. Wrinkles are formed in corresponding portions of the flexible outer casing and the elastic fiber web in response to the elastic fiber web not being subject to a bending force.

4 Claims, 4 Drawing Sheets

FLEXIBLE HOUSING AND FABRICATION METHOD THEREOF

CROSS-REFERENCES TO RELATED APPLICATIONS

This application claims the priority of Chinese Patent Application No. 201810294754.0, filed on Mar. 30, 2018, the entire contents of which are incorporated herein by reference.

FIELD OF THE DISCLOSURE

The present disclosure generally relates to the field of electronic product housing technology and, more particularly, relates to a flexible housing and a fabrication method thereof.

BACKGROUND

Flexible electronics technology is an emerging technology in which electronic components made of organic/inorganic material are formed on flexible/ductile plastic or thin metal substrate. Due to its unique flexibility/ductility and highly efficient and low-cost fabrication process, the flexible electronics technology is widely adopted in information technology, energy, medicine, and defense industries. For example, flexible electronics may include flexible electronic monitors, organic light emitting diodes (OLED), printed radio frequency identifications (RFID), thin film solar panels, and skin patches for electronics, etc.

When a flexible screen is bent inwardly toward the surface of the screen, the stretching effect of the flexible housing on the flexible rotating shafts may be illustrated in FIG. 1. When a device body is straightened, neither the flexible screen nor the housing is stretched. When the device body is bent, the flexible screen may be purely bent while the bent portion of the flexible housing may be substantially stretched and lengthened. To ensure that the flexible screen itself is neither stretched nor contracted, and is purely bent, the flexible housing of the device may be forced to withstand substantial and repeated stretching and bending motions. Thus, the performance requirement for the material of the flexible housing may be extremely stringent. For example, the housing material may be required to have little or no creep. Within the life span of the device, the housing may not suffer fatigue fracture, may be properly sealed, waterproof and dustproof, and may have an aesthetic appearance and a smooth touch.

The disclosed flexible housing and fabrication method thereof are directed to solve one or more problems set forth above and other problems in the art.

BRIEF SUMMARY OF THE DISCLOSURE

One aspect of the present disclosure provides a flexible housing. The flexible housing includes: a rigid frame including at least two separate rigid members; an elastic fiber web, in which two ends of the elastic fiber web are coupled to the two rigid members to form a bending portion; a flexible outer casing arranged over an outer surface of the elastic fiber web. Wrinkles are formed in corresponding portions of the flexible outer casing and the elastic fiber web in response to the elastic fiber web bot being subject to a bending force.

Another aspect of the present disclosure provides a method of fabricating a flexible housing. The method includes: coupling two rigid members to two ends of an elastic fiber web respectively to form a housing; placing the housing in a mold, in which the elastic fiber web is pre-stretched to form a bent surface of the housing; forming a flexible outer casing on an outer surface of the elastic fiber web by injection-molding; and forming wrinkles on the flexible outer casing in response to the pre-stretched elastic fiber web being contracted and straightened.

Another aspect of the present disclosure provides an electronic device. The electronic device includes a display screen and a flexible housing attached to the display screen. The flexible housing includes: a rigid frame including at least two separate rigid members; an elastic fiber web, wherein two ends of the elastic fiber web are coupled to the two rigid members; and a flexible outer casing arranged over an outer surface of the elastic fiber web. Wrinkles are formed in corresponding portions of the flexible outer casing and the elastic fiber web in response to the elastic fiber web not being subject to a bending force.

Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. Obviously, the drawings described below are merely some embodiments of the present disclosure. Other drawings may be derived from such drawings by a person with ordinary skill in the art without creative efforts and may be encompassed in the present disclosure.

DETAILED DESCRIPTION

Figure 1:
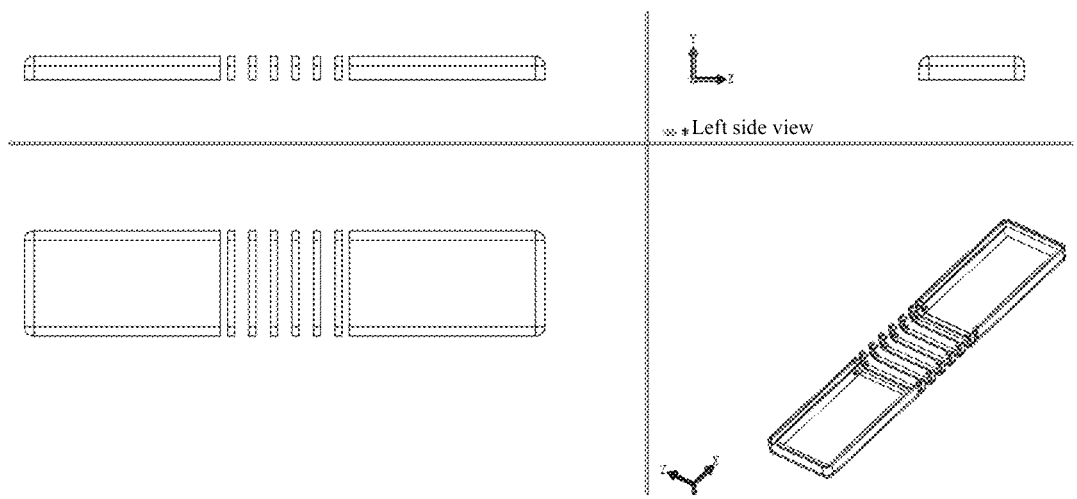
FIG. 1 illustrates a schematic view of a rigid frame and rigid support members of an example of a flexible housing according to some embodiments of the present disclosure.

To make the foregoing objectives, features and advantages of the present disclosure clearer and more understandable, the present disclosure will be further described with reference to the accompanying drawings and embodiments.

However, exemplary embodiments may be embodied in various forms and should not be construed as limited to the embodiments set forth herein. Rather, these embodiments are provided to fully convey the thorough and complete concepts of the exemplary embodiments to those skilled in the art.

Examples of the existing flexible housing are described as follows.

One example of the flexible housing may be made of rubber. The flexible housing may be molded to include a plurality of large saw-tooth shaped wrinkles (like a foldable hand fan with a serrated cross-section). The stretching and contracting of the flexible housing may be converted to the deformation of the saw-tooth shaped wrinkles in response to the stretching and contracting.

Such flexible housing may have some drawbacks. Under the constraints of the wall thickness of the housing and the ductility of the housing material, the molded saw-tooth shaped wrinkles may be large. The entire housing may appear thick, bloated, and loose, thereby negatively affecting the appearance and the touch.

When a single elastic material is used to form a smooth housing without the saw-tooth shaped wrinkles, both polyurethane and silicone materials may have performance limitations.

The flexible housing may be made of polyurethane elastic material with a strong tensile strength. The polyurethane material may have superior overall mechanical properties. However, the substantial tensile modulus may require a substantially large force to stretch, thereby readily damaging the precision flexible shaft. Thus, the user experience is poor.

The flexible housing may also be made of silicone material with a weak tensile strength. The tensile modulus of silicone material may be made smaller. However, the silicone material may have inferior overall mechanical properties, and may readily fracture when being stretched. Thus, the life span of the housing is substantially short.

Another example of the flexible housing may be made of metal. The metal strips coupled to the rotating shafts may interweave with each other to form a structure similar to window blinds, thereby covering the back of the rotating shafts.

Such flexible housing may have some drawbacks as well. Gaps may exist between the metal strips. Dust, water, and even hairs may have chances to enter the gaps. When the gaps between the metal strips are too large and sharp, finger cuts may be likely to occur.

The present disclosure provides a flexible housing and a fabrication method thereof directed to solve one or more problems set forth above and other problems in the art. The flexible housing according to the present disclosure may have a thin thickness and a low tensile modulus and may resist fatigue fracture.

The present disclosure provides a flexible housing. The flexible housing may include a rigid frame, an elastic fiber web, and a flexible outer casing. The rigid frame may include at least two separate rigid members. Two ends of the elastic fiber web may be coupled to the two separate rigid members to form a bendable portion. The flexible outer casing may be arranged over an outer surface of the elastic fiber web. When the elastic fiber web is not subject to a bending force, the flexible outer casing may have wrinkles in a portion corresponding to the elastic fiber web.

In one embodiment, the rigid frame may include at least two separate rigid members to form the housing frame. The elastic fiber web may be disposed in a gap region between the two separate rigid members. The two ends of the elastic fiber web may be coupled to the two separate rigid members to form the bendable portion, thereby achieving the bendable function of the flexible housing.

In one embodiment, one or more rigid support members may be configured between the two separate rigid members that are coupled to the two ends of the elastic fiber web. The elastic fiber web may enclose the outer surface of the rigid support members and may attach to the rigid support members.

FIG. 1 illustrates a schematic view of a rigid frame and rigid support members of an example of a flexible housing according to some embodiments of the present disclosure. In one embodiment, as shown in FIG. 1, a plurality of thermally-melt coupling posts may be configured on an inner surface of the rigid frame to couple metal flexible rotating shafts.

There is no special limitation on the material of the rigid frame and the rigid support members. The rigid frame and the rigid support members may be made of a general-purpose rigid material for the housing, for example, a rigid resin material, a PEEK, or a light weight metallic material. The housing wall made of such material may be thin and light weight and may still have superior mechanical properties.

The elastic fiber web may include fibers arranged in a length direction parallel with or roughly parallel with a bending direction and fibers arranged in a width direction perpendicular to or roughly perpendicular to the bending direction. In one embodiment, the fibers in the length direction and the fibers in the width direction may be interweaved to form a lattice-shaped elastic fiber web.

Lengthwise fibers parallel with or roughly parallel with the bending direction may be defined as fibers arranged in the length direction parallel with the bending direction or forming an angle of smaller than 45° with the bending direction. Widthwise fibers perpendicular to or roughly perpendicular to the bending direction may be defined as fibers arranged in the width direction perpendicular to the bending direction or forming an angle of greater than 45° with the bending direction.

Figure 2:
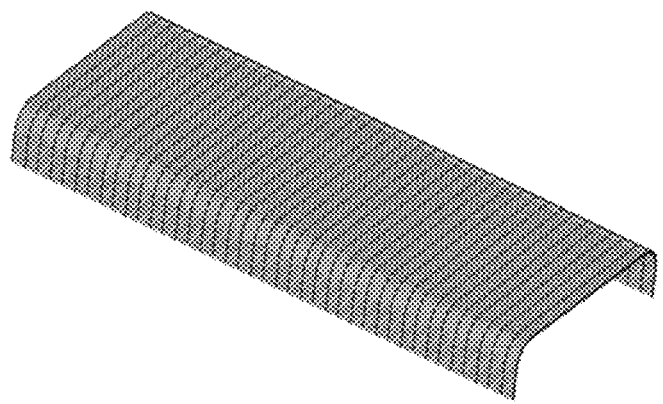
FIG. 2 illustrates a schematic view of an elastic fiber web of an example of a flexible housing according to some embodiments of the present disclosure.

In some embodiments, the elastic fiber web may be formed by interweaving the lengthwise fibers parallel with the bending direction and the widthwise fibers perpendicular to the bending direction. Due to process requirements or process constraints, the fibers may be arranged in a direction deviating from the intended direction by smaller than 15°, preferably smaller than 10°. The deviation may be clockwise or counterclockwise. FIG. 2 illustrates a schematic view of an elastic fiber web of an example of a flexible housing according to some embodiments of the present disclosure.

Figure 3:
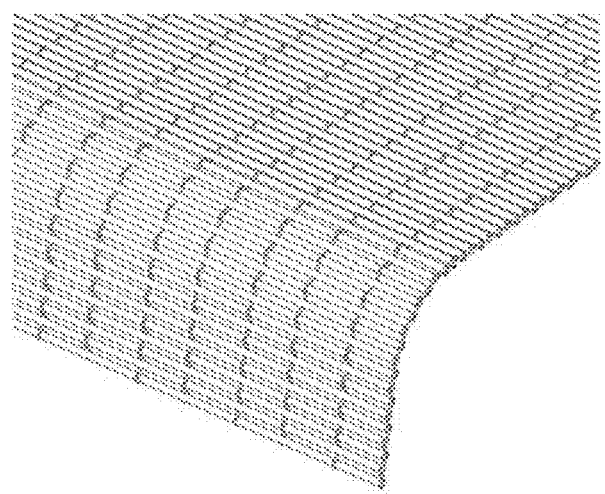
FIG. 3 illustrates a partial enlarged view of an elastic fiber web of an example of a flexible housing according to some embodiments of the present disclosure.

FIG. 3 illustrates a partial enlarged view of an elastic fiber web of an example of a flexible housing according to some embodiments of the present disclosure. The elastic fiber web may be configured in a manner as to provide a high ductility and a high elasticity at the same time, thereby facilitating the flexible housing to resume a straightened state after being bent.

In one embodiment, the lengthwise fibers may have a fiber diameter greater than that of the widthwise fibers. The thicker lengthwise fibers may provide the desired ductility and elasticity satisfying the bending need of the flexible housing. The thinner widthwise fibers may be sufficient to withstand a less substantial widthwise stress when the flexible housing is bent. The thinner widthwise fibers may be beneficial to reduce an overall thickness of the flexible housing.

In one embodiment, the elastic fiber web may be made of crosslinked elastic fibers, such as polyurethane elastic fibers, aramid fibers, and polyethylene fibers, etc. The use of the crosslinked elastic fibers may substantially improve the creep resistance.

The elastic fiber web may be coupled to the rigid members and the rigid support members by adhesive bonding or other methods of bonding well known to those skilled in the art.

The flexible housing may also include the flexible outer casing. The flexible outer casing may be arranged over the outer surface of the elastic fiber web. When the elastic fiber web is not subject to the bending force, the flexible outer casing may have wrinkles in the portion corresponding to the elastic fiber web.

Figure 4:
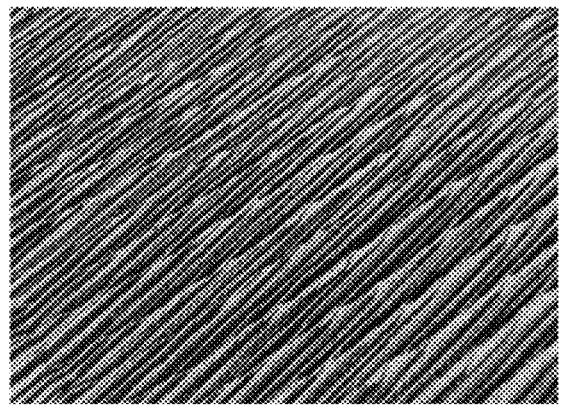
FIG. 4 illustrates a schematic view of wrinkles of an example of a flexible housing according to some embodiments of the present disclosure.

FIG. 4 illustrates a schematic view of wrinkles of an example of a flexible housing according to some embodiments of the present disclosure. In one embodiment, as shown in FIG. 4, when the flexible housing is bent, the elastic fiber web may be bent and deformed by the bending force. The bendable portion of the flexible housing may be tightened. The wrinkles of the outer casing may be reduced to a smoother surface. When the flexible housing is bent to the maximum extent, the wrinkles of the flexible outer casing may be stretched to a completely smooth surface. The provision of the wrinkles may reduce the tensile modulus of the flexible housing and may reduce the risk of tensile fracture of the flexible housing.

In one embodiment, the flexible outer casing may be arranged over the outer surface of the rigid frame. The flexible outer casing may have a smooth surface and may be formed integrally with the flexible housing. The flexible outer casing may be made of a general-purpose flexible resin, such as silicone, which may have an elastic touch and a thin thickness.

In one embodiment, short fibers may be dispersed in a base material of the flexible outer casing to enhance the puncture resistance and tensile tear resistance, suppress existing cracks from spreading, and extend the life span of the flexible housing. The short fibers may be ultrafine short fibers, such as aramid short fibers, having a strong tensile strength and a high tensile modulus.

In some embodiments, the wrinkles may be configured in the bending portion of the flexible housing. When the device body is bent, the wrinkles portion of the flexible outer casing may be stretched to the smooth surface, and the tensile modulus may not increase. The bending of the device may be damped by the flexible rotating shafts. Thus, the risk of the tensile fracture of the flexible housing may be reduced, and the user experience may be improved.

When the flexible housing is bent, only the embedded elastic fiber web may be stretched, and the flexible outer casing may be hardly stretched. Therefore, the flexible housing may be subject to almost no creep. After being repeatedly stretched for an extended period of time, only the elastic fiber web may be subject to a minor creep, which may be covered by the micro wrinkles.

In addition, the flexible housing may be properly sealed, waterproof and dustproof. The flexible housing may have an aesthetic appearance and smooth touch. Because the short fibers embedded in the base material of the flexible outer casing act as strengthening members, the flexible housing may have a superior fatigue fracture resistance and a long-lasting life span.

Figure 9:
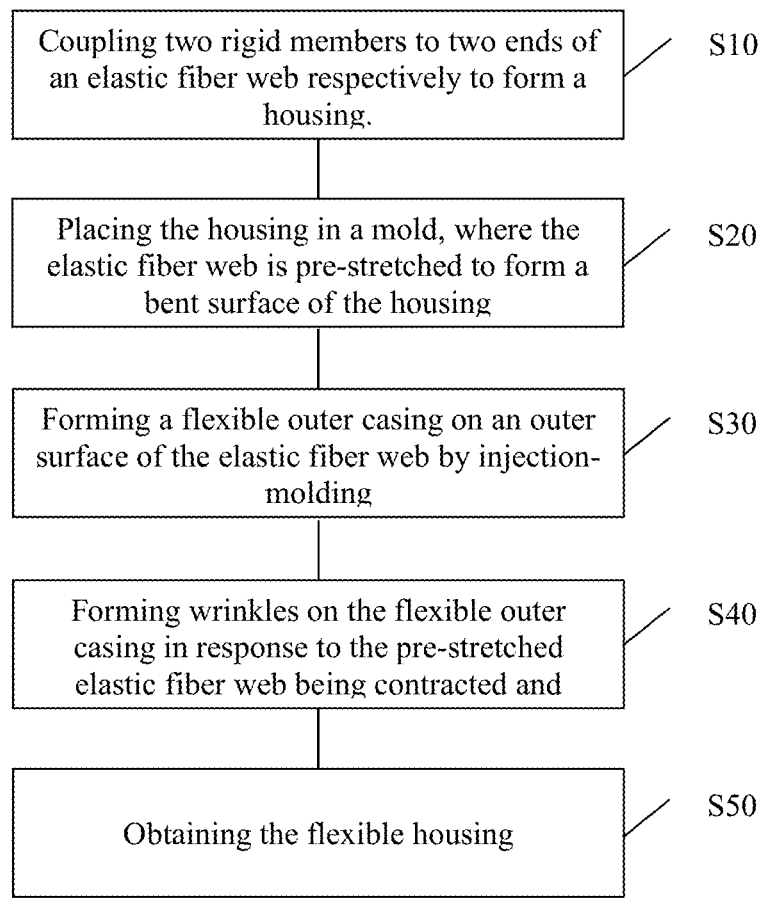
FIG. 9 illustrates a flow chart of an example of a method of fabricating a flexible housing according to some embodiments of the present disclosure.

The present disclosure also provides a method of fabricating the flexible housing. FIG. 9 illustrates a flow chart of an example of a method of fabricating a flexible housing according to some embodiments of the present disclosure. As shown in FIG. 9, the method may include the following steps.

Step S10: coupling two rigid members to two ends of an elastic fiber web respectively to form a housing. Specifically, two ends of an elastic fiber web may be coupled to two rigid members respectively to form a housing.

In one embodiment, the elastic fiber web may be arranged as follows. A plurality of fibers may be arranged in a lengthwise direction parallel or roughly parallel with a bending direction. A plurality of fibers may be arranged in a widthwise direction parallel or roughly parallel with the bending direction. The lengthwise fibers and the widthwise fibers may be interweaved to obtain the elastic fiber web. The lengthwise fibers may have a diameter greater than that of the widthwise fibers. The material of the fibers may be the same as previously described and will not be repeated herein.

The rigid members may be injection-molded using a rigid resin material. In one embodiment, the thermally-melt coupling posts may be injection-molded on the inner surface of the rigid members.

The two ends of the elastic fiber web may be coupled to the rigid members. In one embodiment, the rigid members and the elastic fiber web may be bonded by an adhesive material. In another embodiment, one or more rigid support members may be coupled to the inner surface of the elastic fiber web between the two rigid members that are coupled to the two ends of the elastic fiber web. The rigid support members may be arranged in parallel with the rigid members. The rigid support members may be injection-molded using a rigid resin material. The elastic fiber web and the rigid support members may be bonded by an adhesive material.

Step S20: placing the housing in a mold, where the elastic fiber web is pre-stretched to form a bent surface of the housing by the elastic fiber web and the two rigid members. Specifically, the housing may be placed in a mold. The elastic fiber web may be pre-stretched. The bent surface of the housing may be formed by the elastic fiber web and the two rigid members.

In one embodiment, after being formed by coupling the elastic fiber web, the flexible housing may be placed in a mold. The elastic fiber web may be pre-stretched. A bent surface of the housing may be formed by the elastic fiber web and the two rigid members.

The process step of pre-stretching the elastic fiber web may prevent the elastic fiber web from being displaced or deformed when the flexible outer casing is injection-molded, while forming the micro wrinkles on the flexible outer casing.

Step S30: forming a flexible outer casing on an outer surface of the elastic fiber web by injection-molding. Specifically, a flexible outer casing may be injection-molded on the outer surface of the elastic fiber web.

In one embodiment, after the mold is closed, a flexible outer casing may be injection-molded on the outer surface of the elastic fiber web.

Step S40: after demolding, forming wrinkles on the flexible outer casing in response to the pre-stretched elastic fiber web being contracted and straightened. Specifically, after demolding, the pre-stretched elastic fiber web may resume to a contracted and straightened state. Wrinkles may be formed on the flexible outer casing.

In one embodiment, the fibers may be preprocessed and pretreated with a protective coating layer. The protective coating layer may be bonded securely with the fibers.

However, the protective coating layer may be bonded loosely with the flexible outer casing. Thus, when being stretched and contracted, the fibers may be slightly displaced with the flexible outer casing, thereby forming the wrinkles of the flexible outer casing.

After demolding, the pre-stretched elastic fiber web may return to a contracted and straightened state. Wrinkles may be formed on the flexible outer casing.

Step S50: forming the flexible housing. Specifically, the flexible housing may be obtained.

In one embodiment, the flexible housing may be obtained. After the flexible housing is formed, post-treatments such as removing gate marks and flash edges may be performed.

In some embodiments, after the flexible housing is formed, a highly adherent finishing oil may be sprayed on the outer surface to form a smooth-touch coating layer, thereby improving the user experience.

When the flexible housing is straightened, i.e., the elastic fiber web is not subject to a bending force, the micro wrinkles may appear in the bending portion of the flexible outer casing due to the contraction of the pre-stretched elastic fibers. When the flexible housing is bent, the micro wrinkles in the bending portion may be stretched to a smooth surface.

In some embodiments, after the mold is closed, both the outer surface of the elastic fiber web and the outer surface of the rigid frame may be injection-molded to form the flexible outer casing. The smooth surface of the flexible outer casing may be arranged over the outer surface of the rigid frame. The flexible outer casing may be made of a general-purpose flexible resin, such as silicone.

In one embodiment, short fibers may be dispersed in the base material of the flexible outer casing to enhance the puncture resistance and tensile tear resistance, suppress existing cracks from spreading, and extend the life span of the flexible housing. The short fibers may be well known ultrafine short fibers, such as aramid short fibers, having a strong tensile strength and a high tensile modulus.

In one embodiment, the short fibers may be submerged and coated with a protective coating layer. The protective coating layer may not only prevent silver catalyst mixed in the liquid silicone from poisoning users, but also help spreading the short fibers evenly in the liquid silicone. In addition, the protective coating layer may enhance the bonding force between the short fibers and the silicone base material, thereby preventing the formation and spreading of cracks in the silicone.

After the flexible housing is formed, the thermally-melt coupling posts that are injection-molded on the inner surface of the rigid members may be inserted into the coupling holes of the flexible rotating shafts. After the thermal melting, the flexible housing and the flexible rotating shafts may be firmly bonded. The flexible rotating shafts may facilitate the flexible screen to bend face-to-face.

In the embodiments of the present disclosure, the elastic fiber web may be introduced into the bending portion of the flexible housing, and when the elastic fiber web is pre-stretched, the flexible outer casing may be injection-molded to form the micro wrinkles. The provision of the micro wrinkles may reduce the tensile modulus of the flexible housing and may reduce the risk of tensile fracture of the flexible housing.

The present disclosure also provides an electronic device, which includes the disclosed flexible housing, or the flexible housing fabricated by the disclosed fabrication method.

The flexible housing may be applied to the electronic devices including, but not limited to, smart phones, watches, tablet computers, and notebook computers, etc.

In one embodiment, the flexible housing may include a PEEK plastics (polyetheretherketone) rigid frame, a polyurethane elastic fiber web, and a silicone flexible outer casing. Aramid short fibers may be dispersed in the silicone.

Specifically, the short fibers may be made of polyurethane. Thick polyurethane short fibers may be arranged in the bending direction. Thin polyurethane short fibers may be arranged in a direction perpendicular to the bending direction. The thick short fibers and the thin short fibers may be interweaved to form the elastic fiber web. The surface of the elastic fiber web may be coated with an elastic protective coating layer for preventing silver catalyst poisoning. The PEEK injection-molded rigid frame may include at least two separate rigid members, and a plurality of rigid support members. Thermally-melt coupling posts may be injection-molded on the inner surface of the rigid members and the rigid support members.

The surface of the rigid members and the rigid support members may be pretreated. Except for the portions connecting the rigid members and the elastic fiber web, all other surfaces of the rigid members and the elastic fiber web may be sprayed with a dielectric layer to enhance the bonding force between the plastics and the liquid silicone. At the same time, edging structures and hole latching structures of the injection material may be utilized to further secure the bonding force.

An adhesive may be applied to the covered portion of the rigid members to bond the rigid members and the elastic fiber web. A type of the adhesive may be selected to avoid poisoning by the silver catalyst in the liquid silicone and to firmly bond the pretreated surface of the elastic fiber web. The high-performance aramid 1414 fibers may be cut into short fibers having a proper length and may be submerged and coated with a dielectric layer. The short fibers may be evenly dispersed into two groups A and B of the liquid silicone to be used later. The rigid frame having the bonded elastic fiber web may be placed into the injection-mold filled with the liquid silicone. The elastic fiber web may be pre-stretched. After the mold is closed, the previously prepared liquid silicone groups A and B evenly dispersed with the short fibers may be mixed together and may be injected into the mold. The liquid silicone may be fast cured. Then, a silicone flexible outer casing may be formed by injection-molding on the outer surface of the rigid frame and the elastic fiber web.

Figure 5:
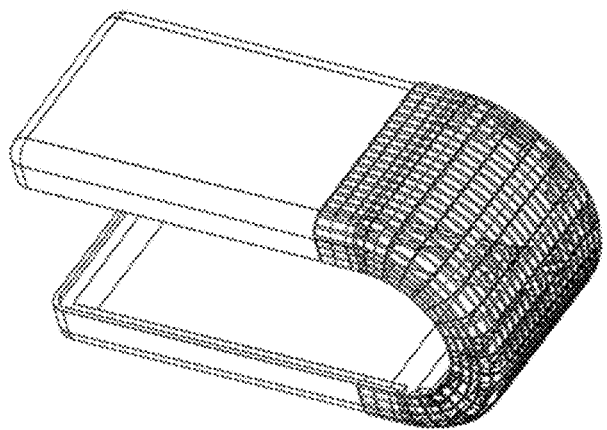
FIG. 5 illustrates a schematic view of a pre-stretched elastic fiber web of an example of a flexible housing according to some embodiments of the present disclosure.

FIG. 5 illustrates a schematic view of a pre-stretched elastic fiber web of an example of a flexible housing according to some embodiments of the present disclosure.

After the mold is opened, the flexible housing may be taken out. The gate marks may be removed. The flash edges may be removed. When the flexible housing is straightened, the micro wrinkles may appear in the bending portion on the surface of the flexible housing due to the contraction of the pre-stretched elastic fiber web. When the flexible housing is bent, the micro wrinkles in the bending portion may be stretched to a smooth surface.

Figure 6:
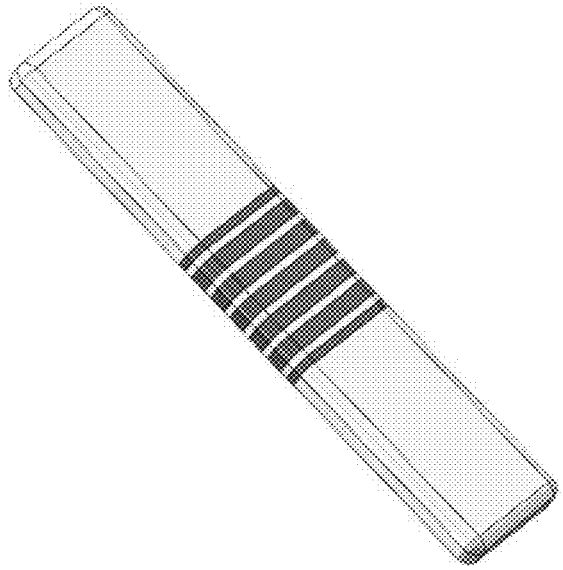
FIG. 6 illustrates a schematic view of wrinkles in a bending portion of an example of a straightened flexible housing according to some embodiments of the present disclosure.

FIG. 6 illustrates a schematic view of wrinkles in a bending portion of an example of a straightened flexible housing according to some embodiments of the present disclosure. The wrinkles may appear in dark gray sections.

Figure 7:
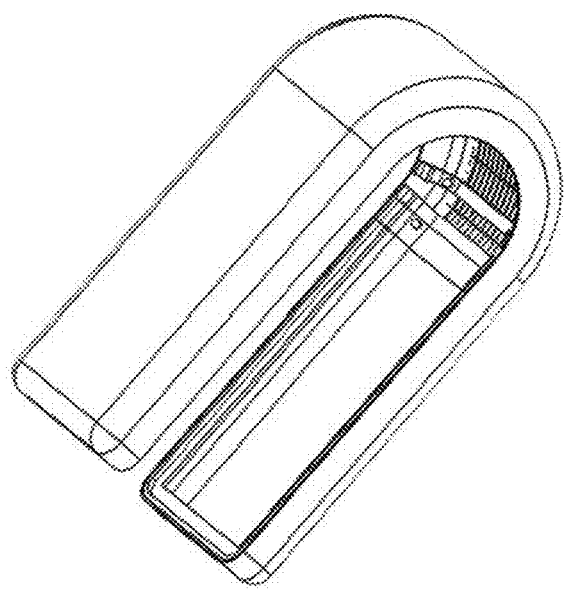
FIG. 7 illustrates a schematic view of a smooth bending portion of an example of a bent flexible housing according to some embodiments of the present disclosure.

FIG. 7 illustrates a schematic view of a smooth bending portion of an example of a bent flexible housing according to some embodiments of the present disclosure.

The thermally-melt coupling posts of the flexible housing may be inserted into the coupling holes of the flexible rotating shafts. After the thermal melting, the injection-molded flexible housing and the rotating shafts may be firmly bonded. The rotating shafts may facilitate the flexible screen to bend face-to-face.

Figure 8:
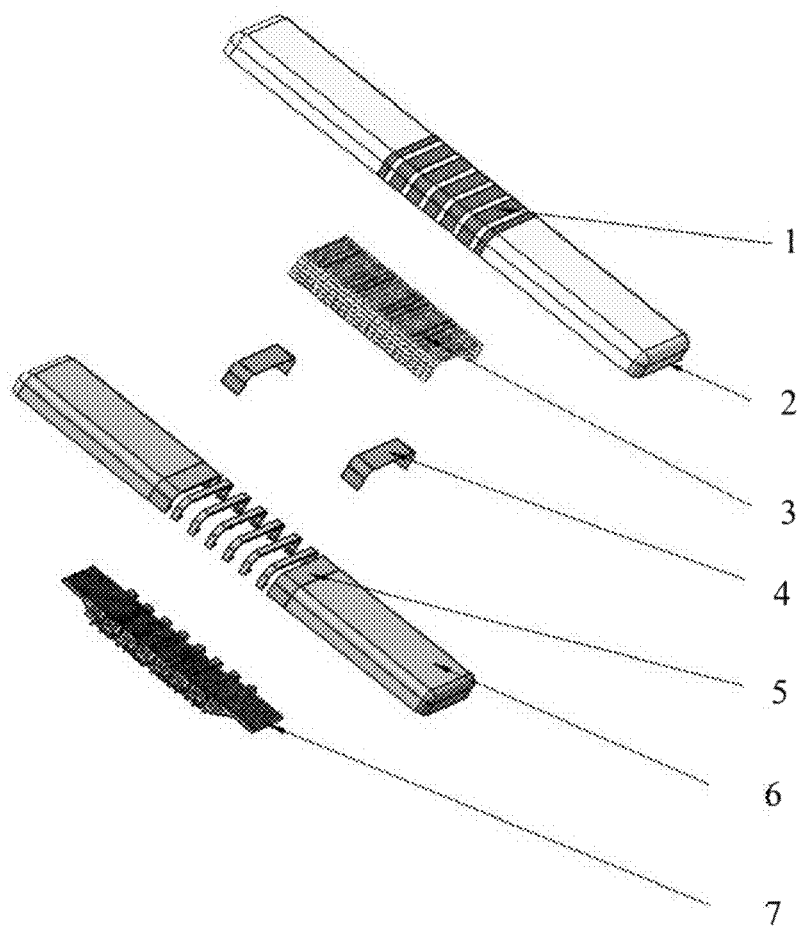
FIG. 8 illustrates an exploded view of an example of a flexible housing according to some embodiments of the present disclosure.

FIG. 8 illustrates an exploded view of an example of a flexible housing according to some embodiments of the present disclosure. As shown in FIG. 8, 1 denotes the wrinkles portion, 2 denotes the flexible outer casing, 3 denotes the elastic fiber web, 4 denotes the adhesive, 5 denotes the rigid frame, 6 denotes the dielectric layer on the surface of the rigid frame, and 7 denotes the metal flexible rotating shafts.

In the embodiments of the present disclosure, the protective coating layer applied to the surface of the elastic fiber web or the rigid frame may be any suitable type well known to those skilled in the art, which is not limited by the present disclosure.

It can be seen from the above embodiments that the flexible housing fabricated by the disclosed fabrication method may have a thin thickness and a low tensile modulus and may resist fatigue fracture.

The present disclosure provides a flexible housing. The flexible housing may include a rigid frame, an elastic fiber web, and a flexible outer casing. The rigid frame may include at least two separate rigid members and an elastic fiber web. Two ends of the elastic fiber web may be coupled to the rigid members respectively to form a bending portion. The flexible outer casing may be arranged over an outer surface of the elastic fiber web. When the elastic fiber web is not subject to a bending force, wrinkles may be disposed in a portion corresponding to the flexible outer casing and the elastic fiber web. In the present disclosure, the elastic fiber web may be configured in the bending portion of the flexible housing. Pre-stretching the elastic fiber web may allow wrinkles to be formed in the bending portion. When a device body is bent, only the wrinkles portion of the flexible outer casing may be stretched to a smooth surface. Thus, the tensile modulus may not be increased, and the risk of tensile fracture of the flexible housing may be reduced. At the same time, the provision of the wrinkles may get rid of creep when the flexible housing is stretched. In addition, the flexible housing may provide functions such as waterproof and dustproof, thereby satisfying the requirements of the flexible housing for the flexible screen products.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An electronic device, comprising:
   a display screen; and a flexible housing attached to the display screen, wherein the flexible housing includes: a rigid frame including at least two separate rigid members;
   an elastic fiber web, wherein two ends of the elastic fiber web are coupled to the two rigid members; and
   a flexible outer casing arranged over an outer surface of the elastic fiber web, wherein wrinkles are formed in corresponding portions of the flexible outer casing and the elastic fiber web in response to the elastic fiber web not being subject to a bending force; wherein one or more separate rigid support members are disposed between the two rigid members that are coupled to the two ends of the elastic fiber web and enclosed rotating shafts; the elastic fiber web encloses an outer surface of each rigid support member; lengthwise fibers are arranged parallelly with a bending direction; widthwise fibers are arranged perpendicularly to the bending direction; the lengthwise fibers and the widthwise fibers are interweaved to form the elastic fiber web; and the lengthwise fibers have a diameter greater than that of the widthwise fibers.

2. The electronic device according to claim 1, wherein in the flexible housing:
   the flexible outer casing is made of a base material including evenly dispersed short fibers.

3. The electronic device according to claim 1, wherein in the flexible housing:
   the elastic fiber web is made of polyurethane.

4. The electronic device according to claim 1, wherein in the flexible housing:
   a plurality of thermally-melt coupling posts are placed on an inner surface of the rigid frame.

* * * * *